(12) United States Patent
Okorn-Schmidt et al.

(10) Patent No.: US 8,709,165 B2
(45) Date of Patent: Apr. 29, 2014

(54) METHOD AND APPARATUS FOR SURFACE TREATMENT USING INORGANIC ACID AND OZONE

(75) Inventors: Harald Okorn-Schmidt, Klagenfurt (AT); Franz Kumning, Lieserbruecke (AT); Rainer Obweger, Lind im Drautal (AT); Thomas Wirnsberger, Seeboden (AT)

(73) Assignee: Lam Research AG, Villach (AT)

( * ) Notice: Subject to any disclaimer, the term of this patent is extended or adjusted under 35 U.S.C. 154(b) by 469 days.

(21) Appl. No.: 12/959,924

(22) Filed: Dec. 3, 2010

(65) Prior Publication Data

US 2012/0138097 A1    Jun. 7, 2012

(51) Int. Cl.
*B08B 7/00* (2006.01)

(52) U.S. Cl.
USPC .................................. 134/19; 134/18; 134/34

(58) Field of Classification Search
None
See application file for complete search history.

(56) References Cited

U.S. PATENT DOCUMENTS

| | | | |
|---|---|---|---|
| 3,890,176 A | 6/1975 | Bolon | |
| 5,559,924 A | 9/1996 | Kadotani et al. | |
| 5,971,368 A | 10/1999 | Nelson et al. | |
| 6,032,682 A | 3/2000 | Verhaverbeke | |
| 6,433,314 B1 | 8/2002 | Mandrekar et al. | |
| 6,461,801 B1 | 10/2002 | Wang | |
| 6,485,531 B1 | 11/2002 | Schoeb | |
| 6,488,271 B1 | 12/2002 | Nelson et al. | |
| 6,696,228 B2 | 2/2004 | Muraoka et al. | |
| 6,701,941 B1 | 3/2004 | Bergman et al. | |
| 6,851,873 B2 | 2/2005 | Muraoka et al. | |
| 6,869,487 B1 | 3/2005 | Bergman | |
| 7,819,984 B2 | 10/2010 | DeKraker et al. | |
| 2004/0043337 A1 | 3/2004 | Chen et al. | |
| 2004/0221877 A1 | 11/2004 | Bergman | |
| 2005/0260835 A1 | 11/2005 | Sha et al. | |
| 2007/0123052 A1 | 5/2007 | Kashkoush et al. | |
| 2007/0161248 A1 | 7/2007 | Christenson et al. | |
| 2007/0224792 A1 | 9/2007 | Tomita et al. | |
| 2007/0227556 A1 | 10/2007 | Bergman | |
| 2009/0073040 A1 | 3/2009 | Sugiyama | |
| 2009/0281016 A1 | 11/2009 | Cooper et al. | |

FOREIGN PATENT DOCUMENTS

| | | |
|---|---|---|
| CN | 1649100 A | 8/2005 |
| EP | 1100630 | 5/2001 |
| TW | 200903604 A | 1/2009 |
| WO | 9502895 | 1/1995 |
| WO | 9952654 | 10/1999 |
| WO | 0212972 A2 | 2/2002 |
| WO | 2007123052 | 11/2007 |
| WO | 2010113089 | 10/2010 |

OTHER PUBLICATIONS

International Search Report, dated Apr. 18, 2012, from corresponding application No. PCT/IB11/55327.
Translation of the Notification of Examination Opinions, dated Oct. 17, 2013, from corresponding TW application.

*Primary Examiner* — Eric Golightly
(74) *Attorney, Agent, or Firm* — Young & Thompson

(57) ABSTRACT

Improved removal of ion-implanted photoresist in a single wafer front-end wet processing station is achieved by dissolving gaseous ozone into relatively cool inorganic acid, dispensing the acid ozone mixture onto a wafer, and rapidly heating the surface of the wafer to a temperature at least 30° C. higher than the temperature of the acid ozone mixture.

7 Claims, 4 Drawing Sheets

METHOD AND APPARATUS FOR SURFACE TREATMENT USING INORGANIC ACID AND OZONE

BACKGROUND OF THE INVENTION

1. Field of the Invention

The invention relates to methods and apparatus for treating surfaces of articles, such as semiconductor wafers, using combinations of inorganic acid and ozone.

2. Description of Related Art

Semiconductor wafers undergo a variety of wet processing stages during manufacture of integrated circuits, one of which is removal of photoresist from the wafer. When the photoresist is stripped by a wet process, among the techniques used for that stripping is a SOM (sulfuric acid ozone mixture) process. These processes involve dissolving ozone in sulfuric acid so that the ozone reacts with the sulfuric acid to form dipersulfuric acid or peroxydisulfuric acid ($H_2S_2O_8$), as shown by the following equation:

$$2HSO_4^- + O_3 \Longleftrightarrow O_2 + H_2O + S_2O_8^{2-}$$

Ozone that does not react with sulfuric acid can also dissolve as such into the sulfuric acid solution, and thus serve as an oxidizing agent for the material to be stripped.

SOM processes typically dissolve ozone into hot sulfuric acid (110 to 150° C.) before the mixture is dispensed onto a semiconductor wafer for a certain amount of time.

The present inventors have identified a number of disadvantages of the conventional SOM processes, including that the ozone has a significantly lower solubility in sulfuric acid at such high temperatures and second also a very short half life (the half-life of ozone in sulfuric acid at 150° C. has been found to be less than 10 seconds). Consequently, only small amounts of ozone and/or reactive peroxydisulfate ion reach the wafer and thus photoresist strip rates are relatively low, leading to long process times, low throughput and with this high cost-of-ownership.

In addition a continuous dispensing of the mixture is required for the whole process time in order to ensure a continuous supply of ozone and its reaction products to the wafer surface. For long process times this also results in a high chemical cost in terms of sulfuric acid, despite the ability to generate ozone in situ.

Still further, if only one chemical supply system is being used, which serves more than one process chamber, the distances for the chemical distribution lines are typically different to the individual process chambers, leading to a chamber-to-chamber variability in the actual ozone concentration delivered to each wafer.

Previous attempts to improve SOM processes have included dispensing sulfuric acid at a temperature in the range of about 25-150° C. onto the wafer and then providing ozone into the environment around the wafer (U.S. Pat. No. 6,869,487). In this way the ozone has to diffuse through the sulfuric acid layer to reach the photoresist to be decomposed. The diffusion process is however a rather slow process even when only a thin liquid layer is being created, and so most of the active decomposition products from ozone (active radicals with a very short lifetime) cannot reach the photo resist in sufficiently large quantities, leading to a non-optimum strip rate.

It has also been proposed to pressurize the heated liquid and then inject gaseous ozone to increase the concentration of the active species in the liquid (EP 1 100 630 B1, U.S. Pat. No. 5,971,368, U.S. Pat. No. 6,488,271). However, as soon as the pressure on the oversaturated ozonated liquid is reduced, during dispensing of the liquid onto the wafer, bubbles will form as the ozone comes out of solution, causing significant loss in the ozone concentration. Another limitation of this technique is that a pressurized chemical mixing system is required, which adds significantly to cost and raises safety concerns.

SUMMARY OF THE INVENTION

The method and apparatus of the present invention involves combining ozone and inorganic acid at relatively low temperatures, the ozone inorganic acid mixture being present on a surface of an article to be treated, to form a liquid layer on the surface of the article to be treated, followed by heating the surface of the article to be treated during or after dispensing the inorganic acid, to a temperature at least 30° C. greater than the temperature of the inorganic acid. In preferred embodiments, the surface of the article to be treated is heated to a temperature of at least 50° C., and more preferably at least 70° C., in excess of the temperature of the inorganic acid.

In preferred embodiments the inorganic acid and ozone are combined to form an acid-ozone mixture before the acid is dispensed onto the article to be treated. In other embodiments, the acid is first dispensed onto the surface of the article to be treated, and ozone is present in gaseous form within the process chamber, where it passes by diffusion through the layer of inorganic acid formed on the surface of the article.

In some embodiments of the invention the inorganic acid is sulfuric acid, and the temperature of the sulfuric acid ozone mixture may be achieved by actively cooling sulfuric acid to a temperature below about 20° C. in order to increase the dissolved ozone concentration in the liquid, which then is dispensed onto the photoresist-containing wafer. In such a way a very high ozone concentration is achieved directly within the boundary layer at the wafer surface. This method and apparatus permits improving the photoresist removal rate without the need for difficult to handle and maintain equipment such as pressurized mixing systems.

During or directly after dispensing of the inorganic acid onto the wafer surface the liquid and/or the wafer is heated to a temperature above 50° C., preferably above 100° C., and more preferably above 150° C., in order to rapidly decompose the ozone within the boundary layer at the wafer surface.

Many means for heating the wafer can be applied, non-limiting examples of which being IR radiation, steam, and a heated chuck/wafer support.

In another embodiment, the ozone decomposition and with this the radical formation can also be initiated through other means like UV radiation. The result of the ozone decomposition, initiated within the liquid boundary layer at the wafer surface is that very active radical intermediates are being created directly at the spot where they are required. In this way radicals with extremely short half-lifes and other active decomposition intermediates can react immediately with the photo resist and any residual photo resist crust layer.

Photo resist crust layers are very difficult to remove and are present after specific physical treatments of the resist layers, which are very common in the semiconductor industry. This is especially so when the photo resist has previously undergone relatively high rates of ion implantation, for example during doping of the wafer with for example boron or arsenic, which makes the subsequent stripping more difficult to achieve.

The methods and apparatus of the invention are not limited to use on semiconductor wafers, and have application as well for treating surfaces of other materials, for example glass masters and mother panels used in manufacturing optical disks and LCD display panels, as well as for cleaning surfaces of processing chambers used during processing of the above-described substrates.

BRIEF DESCRIPTION OF THE DRAWINGS

Other objects, features and advantages of the invention will become more apparent after reading the following detailed description of preferred embodiments of the invention, given with reference to the accompanying drawings, in which.

DETAILED DESCRIPTION OF PREFERRED EMBODIMENTS

Figure 1:
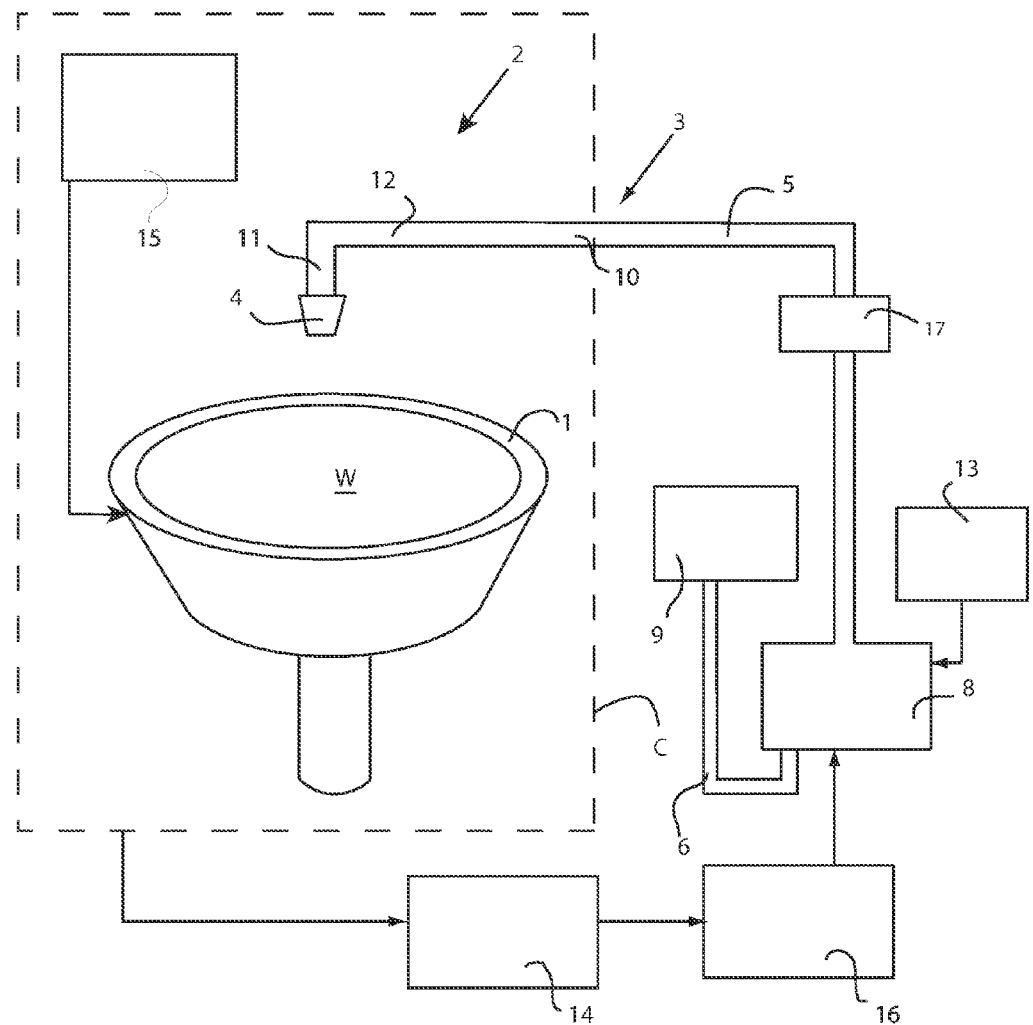
FIG. 1 is a schematic representation of an apparatus for treating surfaces of semiconductor wafers according to an embodiment of the invention.

The term "ozone" as used herein refers not only to ozone in the form of gaseous $O_3$, but also ozone combined with other gases required for generating ozone, such as oxygen, nitrogen or carbon dioxide; ozone as dissolved in a strong inorganic acid such as sulfuric acid; as well as the highly oxidative radicals formed by reaction of ozone with the inorganic acid.

In one embodiment of the method according to the present invention, sulfuric acid is chilled to below 20° C. for example in a tank, and is contacted with ozone gas so as to allow ozone to dissolve in the sulfuric acid. Pure sulfuric acid has a melting point of 10.36° C., whereas 98% sulfuric acid has a melting point of 3.0° C. the temperature to which the sulfuric acid or other inorganic acid is chilled will not be less than its melting point or that of the aqueous solution thereof being used.

However, the temperature at which the acid/ozone mixture is applied to the wafer can be generated can also be a lot higher, for example 35° C. or even higher, provided that the differential between the temperature of the mixture and the temperature to which the substrate is heated is sufficiently large to provide rapid heating.

Furthermore, the ozone and inorganic acid may be combined either by mixing prior to dispensing of the acid onto the article (substrate), or, alternatively, the acid may be dispensed onto the article surface in a process chamber supplied with ozone gas, such that a thin layer of acid is formed on the substrate surface through which the gaseous ozone may diffuse.

Whereas it is known that ozone is more soluble in water at lower temperatures than at higher temperatures, the solubility of ozone in inorganic acids, and especially in sulfuric acid, has not been considered to be a limiting factor in the field of resist stripping, since the ozone is also reactive with the acid to form, in the case of sulfuric acid, the highly oxidative radicals described above. See, e.g., U.S. Pat. No. 6,032,682 at col. 3, lines 6-31.

Thus the uptake of ozone by the acid exceeds the true dissolution of ozone as ozone into the acid to the extent of the occurrence such chemical reactions. The use of cooled inorganic acid according to certain embodiments of the present invention serves not only to increase the concentration of unreacted ozone dissolved in the acid, but also to time-shift the chemical reactions between the ozone and the acid, as to at least a part of the introduced ozone, and permit the generation of the oxidative radicals at the location where their action is desired, the surface of the wafer to be treated.

For contacting the sulfuric acid with ozone gas, in the case of mixing the two prior to dispensing, a variety of techniques and equipment can be used either singly or in combination, e.g. a static mixer, stirring of the solution, and bubbling of ozone through the acid.

When the sulfuric acid is saturated with ozone at a given temperature, or when the sulfuric acid contains a desired concentration of ozone below saturation, the sulfuric acid/ozone mixture is dispensed in sufficient quantities to cover the wafer surface onto a spinning wafer. Preferably, the sulfuric acid/ozone mixture is dispensed in an amount from about 10 to about 100 ml. The wafer is preferably positioned in a closed process chamber of a single wafer wet processing station, and additional ozone gas is preferably supplied to the chamber.

By keeping the spinning wafer enclosed in an environmentally controllable chamber system, the additional ozone gas with which the chamber is filled can be controlled to keep the ozone concentration in the liquid layer on top of the wafer at a constant predetermined level through diffusion.

The thickness of the liquid layer on the wafer can be adjusted through the amount of liquid being dispensed and by adjusting the wafer spin speed.

After the ozone-containing sulfuric acid is dispensed onto the wafer and the liquid layer thickness is adjusted, the liquid and/or the wafer is heated to a set temperature above 50° C., preferably above 100° C., and more preferably above 150° C., in order to initiate the ozone decomposition and radical formation, which then leads to a fast cracking, dissolution or decomposition of the photo resist and/or crust layer.

Once the photo resist and/or crust has been partially or completely removed from the surface, depending on the required process goal, a stream of ammonia gas can be introduced into the process chamber around the sulfuric acid/ozone wetted wafer in order to actively react all sulfate on the surface to form ammonium sulfate and/or ammonium hydrogen sulfate, which then can be easily rinsed off the wafer with DI water or dilute hydrochloric acid or any other chemistry capable of dissolving those salts sufficiently quickly and quantitatively. It may also be desirable in some process to purge any excess ozone gas around the wafer with e.g. nitrogen or purified air before ammonia gas is being brought in the environment around the wafer. Instead of ammonia gas also a dilute ammonia-water solution can be applied for reacting the residual sulfates to the equivalent ammonium salts. When diluted hydrochloric acid is being applied for the removal of the sulfate salts, the process might be followed with a DI water rinse that is approximately pH neutral or slightly acidified with dissolved carbon dioxide.

In FIG. 1 a 300 mm diameter semiconductor wafer is held by a spin chuck 1, in a surrounding processing chamber C for single wafer wet processing. In this embodiment, a dispenser 2 of treatment liquid comprises a dispense arm 3 with a dispense nozzle 4 configured to dispense the treatment liquid onto the wafer in a free flow. The nozzle orifice has a cross-sectional area in the range of 3 to 300 $mm^2$, and preferably 10 to 100 $mm^2$.

The treatment liquid is created by combining a cooled inorganic acid, preferably sulfuric acid, and gaseous ozone. In this embodiment, ozone generator 9 supplies gaseous ozone through pipe 6 into sulphuric acid tank 8, where the ozone bubbles through the acid.

The apparatus of this embodiment also includes a cooler 13 for cooling the inorganic acid in tank 8. In practice the cooler 13 and tank 8 can be embodied as a refrigerated tank. In this embodiment the inorganic acid is sulphuric acid, and the cooler 13 cools the acid to a temperature in a range of 3° C. to less than 20° C., preferably 5° C. to 18° C., and more preferably 10° C. to 15° C. Alternatively or in addition, an in-line cooler can be provided downstream of the outlet of tank 8, along the supply conduit from tank 8 or on the dispense arm 3.

In this embodiment an electrical resistance heater 15 heats the chuck and in turn the wafer either while the cooled SOM liquid is applied to the wafer surface or after the liquid has been applied.

The reference herein to inorganic acids and sulphuric acid is intended to encompass aqueous solutions of such acids, although it is preferred that such solutions are nevertheless relatively concentrated, namely, an initial concentration of at least 80 mass % and preferably of at least 90 mass %. In the case of sulphuric acid, use can be made of concentrated sulphuric acid, having a mass percent of 98.3%.

The apparatus of this embodiment also includes a liquid collector 14 as is known in the art, wherein the liquid can be collected after being spun off a rotating wafer, as well as a recycling system 16 wherein the remaining liquid is returned to a process tank.

A flow controller 17 includes a flow meter for measuring the flow in the liquid line, and can adjust the rate of flow to a desired value.

Dispense nozzle 4 in this embodiment preferably has a cross-sectional area of approximately ¼" and may be formed of plural ⅛" tubes joined to a single ½" tube.

The wafer W is preferably rotating as the treatment liquid is dispensed onto it, and the rotational speed of the wafer is in the range of 0-1000 rpm, preferably 30-300 rpm, preferably at a speed varying over time. The inorganic acid/ozone mixture is supplied at a volumetric flow in the range of 0.5 to 5 liter per minute (lpm), preferably 0.7-2 lpm.

The concentration of the inorganic acid preferably ranges from about 80 to about 98 mass %, which in the case of sulphuric acid includes concentrated sulphuric acid at about 98.3% purity. More preferably, the concentration of the inorganic acid is at least 90 mass %.

Oxidizing gas supply 9 is preferably an ozone generator. In this regard, and as is known to those skilled in the art, ozone ($O_3$) is ordinarily not provided as a pure gas but rather is produced by reacting pure oxygen for example by silent electrostatic discharge, such that the generated ozone comprises oxygen ($O_2$) at a mass % of about 80 to about 98% and ozone in a range of about 1-20 mass %. Reference herein to ozone gas includes such ozone-enriched oxygen gases.

Dispense arm 3 may be configured to operate as a boom swing, and thus move horizontally relative to and across the rotating wafer. The speed and range of the boom swing movement is sufficiently wide and fast as to promote an even temperature distribution of the treatment liquid across the wafer surface, thereby to improve uniformity of treatment over a wafer surface.

Figure 2:
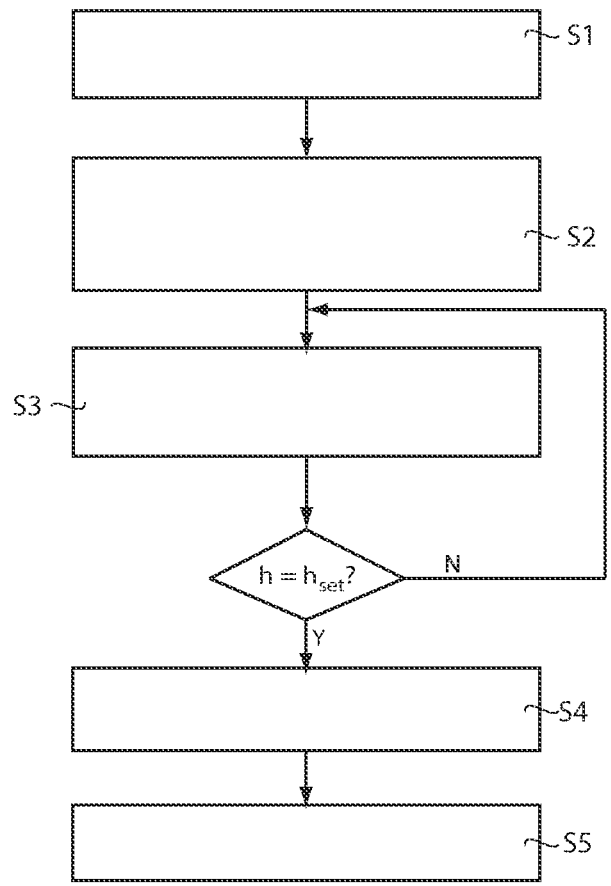
FIG. 2 is a flow chart outlining several steps of a method for treating surfaces of semiconductor wafers according to an embodiment of the invention.

In FIG. 2, a wafer first undergoes optional pretreatment in Step S1 such as wetting to promote the contact and flow properties of the treatment liquid on the wafer surface. Next, the inorganic acid/ozone mixture is dispensed onto the wafer surface in Step S2. The wafer W may be rotated at the rpm described above during either or both of Steps S1 and S2.

When using $H_2SO_4$, the dwell time of the treatment liquid on a 300 mm diameter semiconductor wafer is preferably about 30-240 sec, with a total treatment time (i.e., including any prewet and rinse steps) of about 90-420 sec.

In Step S3, the thickness of the layer of treatment liquid is measured by a suitable optical measuring device to determine whether the measured thickness h equals a target thickness $h_{set}$. The flow rate of treatment liquid and spin speed of the chuck are adjusted until the target thickness is achieved.

In Step S4 the wafer is heated to the desired temperature to initiate/accelerate reaction of the ozone at the wafer interface, and the process is continued until a desired level of stripping has been achieved. The supply of treatment liquid is terminated in Step S5.

As described above, during and following treatment the liquid is collected and returned to the process tank 8, from which it is resupplied to the chamber C.

As the treatment liquid is recovered and recycled, the acid strength will gradually decline after a number of treatment cycles. The acid strength may be restored by addition of fresh acid to the tank 8; alternatively or in addition, the oxidizing power of the treatment liquid can be increased by adding $H_2O_2$ to the tank 8.

By partially draining the collector 14 over successive processing cycles, it can be possible to avoid the need to empty supply tank 8. In particular, the acid supply tank 8 can be kept in continuous service when part of the recovered liquid is drained from collector 14 and part is recirculated to tank 8. After treatment of the wafer with the oxidizing liquid is complete, an optional rinse of the wafer is performed in Step S6.

Figure 3A:
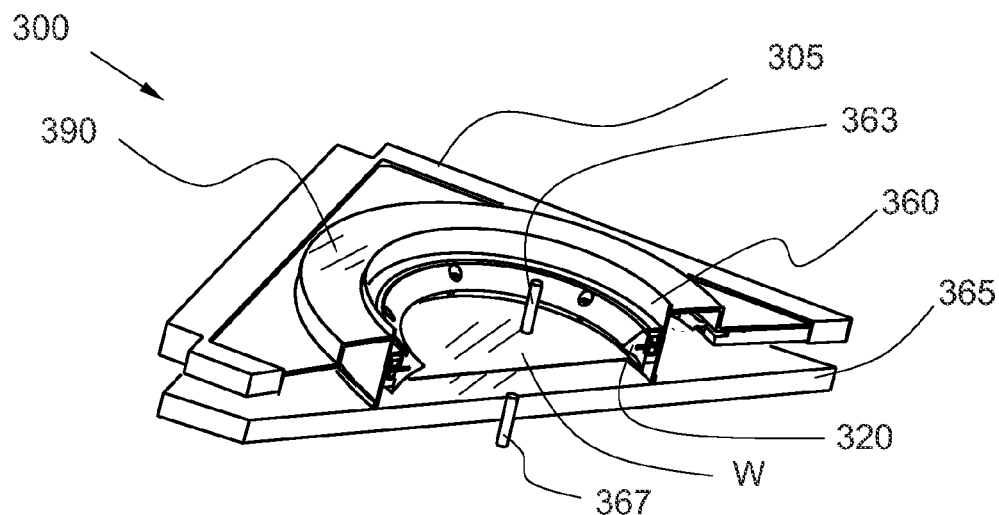
FIG. 3a shows an embodiment of a spin chuck suitable for use in the method and apparatus according to the invention.

FIG. 3a shows a spin chuck based on the designs described in WO 2010/113089A2. The device 300 comprises a chamber, an annular chuck 320 for gripping and rotating a wafer (disc-like article) and a stator 390. The chamber comprises a cylindrical wall, a bottom plate 365 and a top plate (not shown). An upper dispensing tube 363 is led through the top plate and supplies sulfuric acid to the wafer surface to be treated and a peripheral inlet 364 supplies ozone into the chamber. Lower dispensing tube 367 may provide additional process liquid or gas, or a water rinse.

The stator 390 is mounted to a stator base plate 305 concentric to the cylindrical wall 360. The stator base plate 305 can be moved in axial direction with respect to the cylinder axis of the cylindrical wall 360, e.g. with pneumatic lifting means. The stator base plate 305 and the stator 390 mounted thereto have central openings, which have bigger diameter than the outer diameter of the cylindrical wall 360. The top plate can also be moved in axial direction in order to open the chamber. In closed position the top plate is sealed against the cylindrical wall.

The stator 390 comprises several coils for axial and radial bearing and for driving the rotor 385, which is part of the annular chuck. Such arrangement is called active bearing and is further described in U.S. Pat. No. 6,485,531.

Figure 3B:
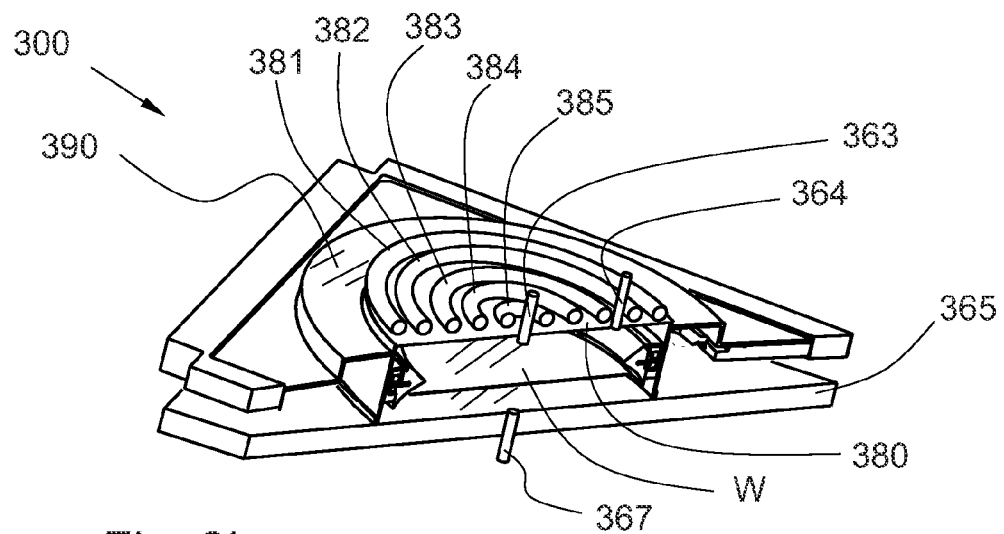
FIG. 3b shows another embodiment of a spin chuck suitable for use in the method and apparatus according to the invention.

In FIG. 3b, the spin chuck has been adapted to include five concentrically arranged annular infra red (IR) heaters 381, 382, 383, 384, 385. The IR-heaters are separately tunable, so as to achieve a desired uniformity of heating across the wafer surface. In other words if it is found out that the edge is not heated fast enough the power to the outermost annular IR-heater 381 is increased. The tuning of the IR-heaters can be optimized by monitoring the treated wafers regarding the uniformity of heating or by monitoring the temperature increase using local thermometers.

The IR-heaters are preferably annular quartz rods. There is an isolative coating provided so that the IR-heaters primarily emit IR-light towards the wafer surface. The chamber and the IR-heaters are separated by a transparent plate 380, e.g. made of heat resistant glass (borosilicate glass), or quartz.

The assembly of IR heaters 381-385 and transparent plate 380 are mounted in the undepicted top plate of the chamber, and are thus in the position shown when the chamber is closed.

Figure 4:
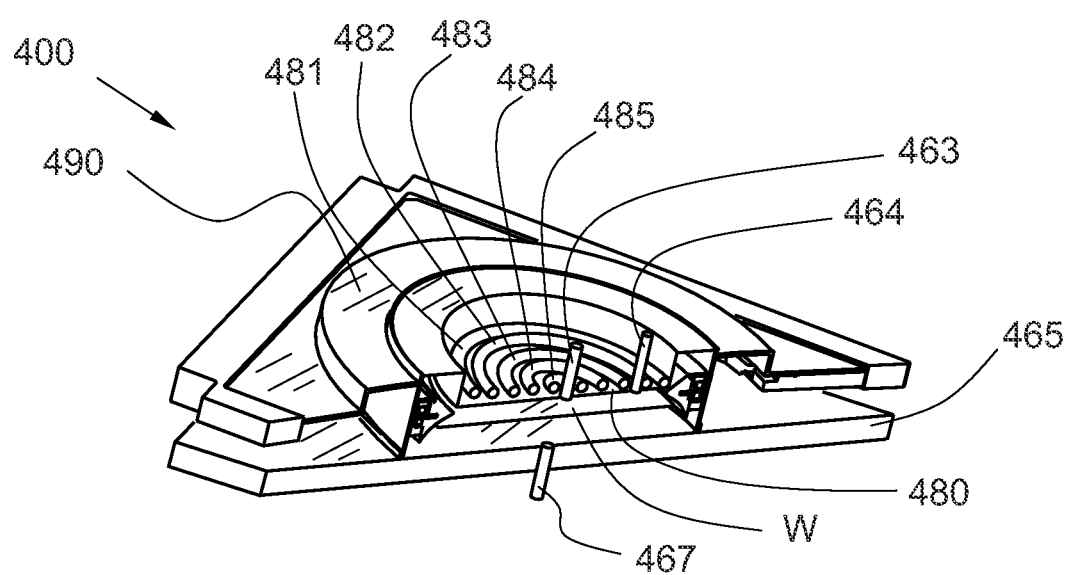
FIG. 4 shows yet another embodiment of a spin chuck suitable for use in the method and apparatus according to the invention.

In the alternative of FIG. 4, the transparent plate 480 is formed in order to provide a much smaller distance (below 10 mm and preferably below 5 mm) between the transparent plate 480 and the wafer W. In particular, the transparent plate 480 of this embodiment has a three-dimensional shape in which the peripheral portion is at a higher level so as to provide clearance for the ring 320, whereas the central portion is at a lower level, and joined to the higher portion by a cylindrical wall, so that the central portion of plate 480 is positioned much closer to wafer W than in the embodiment of FIG. 3b. The higher peripheral portion of plate 480 is joined to the undepicted top plate of the chamber, whereas the lower central portion of plate 480 depends downwardly therefrom.

Those skilled in the art will recognize that a variety of three-dimensional configurations for the transparent plate will be appropriate depending upon the particular structure of the chuck to which the plate is applied. Alternatively, the ring 320 may be formed with plate 480 secured thereto, in which case plate 480 need not have a three-dimensional shape, or in which case the height differential between the peripheral and central regions of plate 480 could be reduced.

Although the heating elements in the foregoing embodiments are concentric rings, the heating elements may alternatively be embodied as tunable spot type IR lamps or tunable linear heating elements.

While the present invention has been described in connection with various preferred embodiments thereof, it is to be understood that those embodiments are provided merely to illustrate the invention, and should not be used as a pretext to limit the scope of protection conferred by the true scope and spirit of the appended claims.

What is claimed is:

1. A method for treating a surface of an article, comprising:

contacting ozone and an inorganic acid at a sub-ambient temperature in a range of from about 3° C. to less than 20° C., to form a liquid mixture comprising ozone dissolved in the inorganic acid;

dispensing said liquid mixture onto a surface of an article to be treated, said liquid mixture having a first temperature;

forming a liquid layer of said liquid mixture on the surface of the article to be treated;

heating the surface of the article to be treated during or after dispensing said liquid mixture, to a second temperature;

wherein the second temperature is at least 30° C. greater than the first temperature.

2. The method according to claim 1, wherein said article is a semiconductor wafer, and wherein said surface to be treated comprises photoresist that includes ions implanted during a previous processing stage.

3. The method according to claim 2, wherein the semiconductor wafer is positioned on a spin chuck in a single wafer wet processing station.

4. The method according to claim 1, wherein the inorganic acid is an aqueous solution of sulphuric acid at a concentration of at least 90 mass % or pure sulphuric acid (oleum).

5. The method according to claim 1, wherein the article to be treated is present in a processing chamber, the method further comprising introducing gaseous ozone into the processing chamber.

6. The method according to claim 1, further comprising heating the surface of the article to be treated during or after dispensing the liquid mixture, to a temperature in excess of 50° C.

7. The method according to claim 1, wherein the surface is heated to a temperature in excess of 100° C.

* * * * *